US011646345B2

(12) United States Patent
Cheng

(10) Patent No.: US 11,646,345 B2
(45) Date of Patent: May 9, 2023

(54) SEMICONDUCTOR STRUCTURE AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 17/004,231

(22) Filed: Aug. 27, 2020

(65) Prior Publication Data

US 2020/0395441 A1    Dec. 17, 2020

Related U.S. Application Data

(63) Continuation of application No. PCT/CN2018/112657, filed on Oct. 30, 2018.

(51) Int. Cl.
*H01L 29/06* (2006.01)
*H01L 29/778* (2006.01)
*H01L 29/267* (2006.01)

(52) U.S. Cl.
CPC ...... *H01L 29/0646* (2013.01); *H01L 29/7786* (2013.01); *H01L 29/0688* (2013.01); *H01L 29/0692* (2013.01); *H01L 29/267* (2013.01)

(58) Field of Classification Search
CPC ... H01L 29/122–127; H01L 29/15–158; H01L 29/42316; H01L 29/6656;
(Continued)

(56) References Cited

U.S. PATENT DOCUMENTS

2006/0003514 A1    1/2006 Richieri
2006/0035449 A1    2/2006 Yoo
(Continued)

FOREIGN PATENT DOCUMENTS

CN    1371133 A    9/2002
CN    104064635 A    9/2014
(Continued)

OTHER PUBLICATIONS

International Search Report issued in corresponding PCT Application No. PCT/CN2018/112657, dated Jun. 20, 2019.
(Continued)

*Primary Examiner* — Natalia A Gondarenko
(74) *Attorney, Agent, or Firm* — Westbridge IP LLC

(57) ABSTRACT

A semiconductor structure and a manufacturing method thereof is provided. The semiconductor structure includes a high-resistance silicon substrate and a compound layer located on the high-resistance silicon substrate, by performing a way such as local n-type ion implantation, local n-type ion diffusion, selective region epitaxy growth and the like to the high-resistance silicon substrate, an upper part of the high-resistance silicon substrate is formed into a plurality of local n-type semiconductor regions, p-type semiconductor conductive regions formed in the upper part of the high-resistance silicon substrate due to a diffusion of Al, Ga atoms in the compound layer are eliminated, thereby parasitic capacitance caused by a conductive substrate is greatly reduced, and a resistivity of the high-resistance silicon substrate may be improved under high temperature conditions, and then efficiencies and radio frequency characteristics of a microwave device constituted by the entire semiconductor structure are improved.

19 Claims, 11 Drawing Sheets

(58) Field of Classification Search
CPC ......... H01L 29/66431; H01L 29/66462; H01L 29/6653; H01L 29/66719; H01L 29/778–7789; H01L 29/7816; H01L 29/808; H01L 29/812; H01L 2924/13064; H01L 27/0629; H01L 27/0688; H01L 27/14683; H01L 29/0646; H01L 29/7786; H01L 29/0688; H01L 29/0692; H01L 29/267; H01L 29/36; H01L 29/2003; H01L 29/783; H01L 21/8252; H01L 21/02381; H01L 21/0254; H01L 21/02658; H01L 21/02002; H01L 21/26513; H01L 21/2254; H01L 21/266; H01L 21/8221; H01L 23/28; H01L 23/291; H01L 23/3171; H01L 23/3192; H01L 21/02183; H01L 21/02164; H01L 21/0228; H01L 21/02274; H01L 21/02107; H01L 21/02112; H01L 21/022; H01L 21/02301; H01L 21/02208; H01L 21/02205; H01L 21/02225; H01L 21/0229; H01L 21/2123; H01L 21/0217; H01L 21/28114; H01L 21/823468; H01L 21/823864; H01L 21/823456; H01L 21/82385

USPC ........... 257/200, 77, 76, 192, 194, 195, 183, 257/E29.104

See application file for complete search history.

(56) References Cited

U.S. PATENT DOCUMENTS

| | | | |
|---|---|---|---|
| 2013/0099249 A1 | 4/2013 | Forcier et al. | |
| 2014/0197462 A1* | 7/2014 | Briere | H01L 29/7786 257/194 |
| 2015/0318360 A1* | 11/2015 | Lu | H01L 21/02381 257/192 |
| 2016/0233329 A1* | 8/2016 | Cheng | H01L 29/66462 |
| 2020/0075314 A1* | 3/2020 | Chen | H01L 29/7786 |

FOREIGN PATENT DOCUMENTS

| | | |
|---|---|---|
| CN | 205376554 U | 7/2016 |
| TW | 201837991 A | 10/2018 |
| WO | 2015054982 A1 | 4/2015 |

OTHER PUBLICATIONS

Written Opinion issued in corresponding PCT Application No. PCT/CN2018/112657, dated Jun. 20, 2019.

* cited by examiner

SEMICONDUCTOR STRUCTURE AND MANUFACTURING METHOD THEREOF

CROSS-REFERENCE TO RELATED APPLICATIONS

The present application is a continuation of International Application No. PCT/CN2018/112657 filed on Oct. 30, 2018, the entire contents of which are incorporated herein by reference.

TECHNICAL FIELD

The present application relates to the fields of electronic communication technologies, in particular to a semiconductor structure and a manufacturing method thereof.

BACKGROUND

With the rapid development of wireless communication technologies, radio frequencies and microwave devices with low transmission loss, low cost and small size have become current research focuses. Based on the technical maturity of silicon materials and the super-large scale of integrated circuit designs, silicon-based chips have entered an era of stability and low cost.

Microwave signals have a large loss on ordinary silicon substrates, and traditional microwave devices and chips are prepared on gallium arsenide substrates with low loss characteristics. In recent years, because high-resistance silicon materials exhibit low transmission loss characteristics, many workers apply the high-resistance silicon materials to the research of the microwave devices. Researches on silicon-based microwave devices based on different doping and substrate materials have confirmed that it is feasible to prepare the microwave devices with low loss on high-resistance silicon substrates.

SUMMARY

The inventor found that: before a compound layer is epitaxy grown on a high-resistance silicon substrate, the high-resistance silicon substrate may maintain a high resistivity; and after the compound layer is epitaxy grown on the high-resistance silicon substrate, atoms such as Al, Ga and the like in the compound layer will diffuse into the high-resistance silicon substrate due to a diffusion effect, thereby a part of the high-resistance silicon substrate is transformed into p-type semiconductor regions. The p-type semiconductor regions formed will seriously influence the efficiency of a microwave device.

It has been reported in a literature that n-type impurities such as N, P and the like may be imported for compensation doping on a surface of the high-resistance silicon substrate, but because an impurity concentration of the p-type semiconductor regions fluctuates within a certain range, therefore it is impossible to realize accurate compensation doping, so that a goal cannot be achieved.

In view of this, a purpose of the present application is to provide a semiconductor structure and a manufacturing method thereof. Technology solutions adopted by the present application are as follows.

A manufacturing method of a semiconductor structure includes following steps: providing a high-resistance silicon substrate; forming an upper part of the high-resistance silicon substrate into a plurality of n-type semiconductor regions locally arranged; growing epitaxially a compound layer on the high-resistance silicon substrate; wherein the compound layer at least includes an element, which diffuses into the high-resistance silicon substrate and forms a p-type semiconductor region in the high-resistance silicon substrate. A part of the high-resistance silicon substrate close to the compound layer is the upper part of the high-resistance silicon substrate; the p-type semiconductor regions and the n-type semiconductor regions form a PN junction, and the p-type semiconductor regions are completely depleted to form a space charge region.

The method for forming an upper part of the high-resistance silicon substrate into a plurality of n-type semiconductor regions includes local n-type ion implantation, local n-type ion diffusion, selective region epitaxy and the like. A depth of each of the plurality of n-type semiconductor regions is 0.01 µm~10 µm, a width of each of the plurality of n-type semiconductor regions is 0.1 µm~2000 µm in a lateral direction, and an interval between adjacent two of the plurality of n-type semiconductor regions is less than 2000 µm.

Further, the compound layer is a III-V group compound layer, atoms such as Al, Ga and the like in the III-V group compound layer make the upper part of the high-resistance silicon substrate form the p-type semiconductor regions due to a diffusion effect, a doping concentration of the p-type semiconductor regions is less than or equal to a doping concentration of the n-type semiconductor regions.

Further, a resistivity of the high-resistance silicon substrate is greater than 100 Ω·cm, preferably, the resistivity of the high-resistance silicon substrate is greater than 1000 Ω·cm.

Further, a thickness of the high-resistance silicon substrate is 100 µm~1500 µm.

Further, doping ions of the n-type semiconductor regions are Phosphorus (P), Nitrogen (N), Arsenic (As) and the like, a doping ion concentration is $1E14\ cm^{-3}$~$1E20\ cm^{-3}$, preferably, $1E15\ cm^{-3}$~$1E17\ cm^{-3}$.

Accordingly, a semiconductor structure is provided. The semiconductor structure includes a high-resistance silicon substrate and a compound layer located on the high-resistance silicon substrate. The high-resistance silicon substrate includes a space charge region, the space charge region is located in an upper part of the high-resistance silicon substrate in contact with the compound layer, and the compound layer at least includes an element, which diffuses into the high-resistance silicon substrate and forms a p-type semiconductor region in the high-resistance silicon substrate.

A thickness of the space charge region is 0.01 µm~10 µm.

The high-resistance silicon substrate also has a plurality of n-type semiconductor regions locally arranged.

The plurality of n-type semiconductor regions of the high-resistance silicon substrate may be formed by local n-type ion implantation, local n-type ion diffusion, and selective region epitaxy.

A semiconductor structure and a manufacturing method thereof are provided by the present application. The semiconductor structure is composed of a high-resistance silicon substrate and a compound layer, by performing a way such as local n-type ion implantation, local n-type ion diffusion, selective region epitaxy growth and the like to the high-resistance silicon substrate, an upper part of the high-resistance silicon substrate is formed into a plurality of local n-type semiconductor regions, p-type semiconductor conductive regions formed on the upper part of the high-resistance silicon substrate due to a diffusion of Al, Ga atoms in the compound layer are eliminated, an entire surface of the high-resistance silicon substrate generally has high-resistance characteristics, and there are only n-type semiconductor regions locally arranged in the high-resistance silicon substrate, thereby parasitic capacitance caused by a conductive substrate is greatly reduced, and a resistivity of the high-resistance silicon substrate may be improved under high temperature conditions, and then efficiencies and radio frequency characteristics of a microwave device constituted by the entire semiconductor structure are improved.

In order to make the above and other purposes, features and advantages of the present application more obvious and understandable, specific embodiments are given below in conjunction with the accompanying drawings, which are described in detail below.

BRIEF DESCRIPTION OF DRAWINGS

In order to more clearly explain embodiments of the present application or technical solutions in the prior art, the following will briefly introduce drawings required in the embodiments. Obviously, the drawings in the following description are only some embodiments of the present application, for those of ordinary skill in the art, other drawings may be obtained based on these drawings without paying creative efforts. The above and other purposes, features and advantages of the present application will be more clear through the drawings. The same reference numerals indicate the same parts in all drawings. The drawings are not intentionally scaled in proportion to an actual size, and the emphasis is on showing spirit of the present application.

DETAILED DESCRIPTION OF THE EMBODIMENTS

Figure 1:
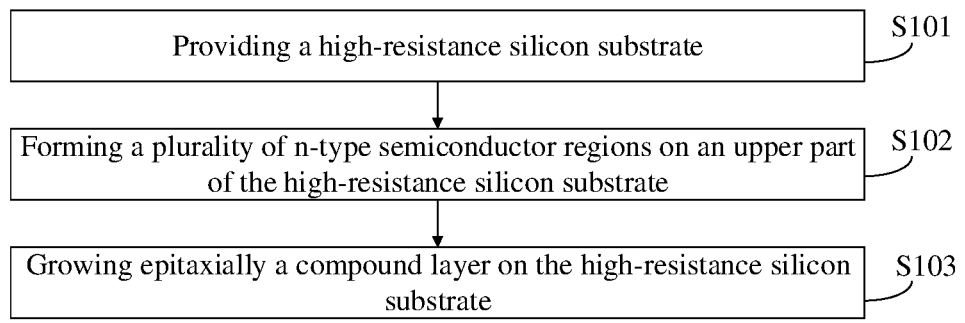
FIG. 1 is a schematic flow chart of a manufacturing method of a semiconductor structure provided by an embodiment of the present application.

Based on embodiments of the present application, all other embodiments obtained by those of ordinary skill in the art without paying creative efforts fall within the protection scope of the present application. Although the embodiments of the present application are described utilizing a semiconductor device including a semiconductor structure of the present application, it will be understood that the embodiments of the present application are not limited thereto, and some embodiments may also be applied to other semiconductor devices.

It should be noted that similar reference numerals and letters indicate similar items in the following drawings, therefore, once an item is defined in one drawing, there is no need to further define and explain it in subsequent drawings. "an embodiment", "embodiment" and the like referenced throughout specification mean that particular features, structures, configurations or characteristics described in connection with the embodiment is included in at least one embodiment of the present application. Therefore, phrases "an embodiment", "embodiment" and the like appeared throughout the specification is not necessarily the same embodiment of the present application. In addition, specific features, structures, configurations or other characteristics may be combined in any suitable manner in one or more embodiments.

Terms "above", "on", and "between" may refer to a relative position of a layer relative to other layers. For the purpose of clarity, a thickness and a size of each layer shown in the drawings may be exaggerated, omitted, or schematically drawn. In addition, a size of a component does not fully reflect an actual size.

FIGS. 1, 2, 3*a*-3*d*, 4*a*-4*h*, 5*a*-5*c*, 6*a*-6*c* and 7 show a process flow of a manufacturing method of a semiconductor structure in embodiments of the present application.

As shown in FIG. 1, the manufacturing method of the semiconductor structure includes following steps.

Figure 2:
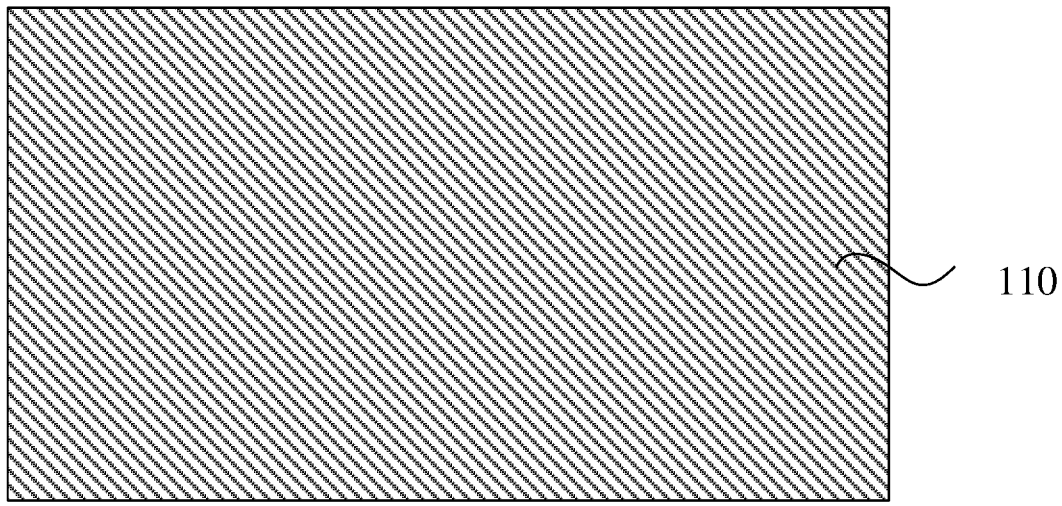
FIGS. 2, 3*a*-3*d*, 4*a*-4*h*, 5*a*-5*c*, 6*a*-6*c* and 7 are structure schematic diagrams of a semiconductor structure corresponding to various process steps in a manufacturing method of a semiconductor structure provided by embodiments.

In step S101, as shown in FIG. 2, a high-resistance silicon substrate 110 is provided. Compared with an ordinary silicon substrate, the high-resistance silicon substrate 110 has the most significant difference in that impurity content is extremely low, resistivity is relatively large, and the resistivity is generally greater than 100 $\Omega\cdot$cm, preferably, the resistivity of the high-resistance silicon substrate 110 is greater than 1000 $\Omega\cdot$cm. In a case where the high-resistance silicon substrate is used in a microwave device, microwave transmission losses may be effectively reduced.

In this embodiment, the high-resistance silicon substrate 110 may be prepared by a suspended zone melting method; in other embodiments, the high-resistance silicon substrate 110 may be obtained by implanting a low-resistance silicon layer utilizing high-energy heavy ions of focused micro beams or large beam currents; the high-resistance silicon substrate 110 may also be obtained by a Czochralski method. The method for preparing the high-resistance silicon substrate 110 is not specifically limited in the present application.

In this embodiment, a thickness of the high-resistance silicon substrate 110 may be 100 µm~500 µm. Of course, those skilled in the art may select a high-resistance silicon substrate with an appropriate thickness according to technical requirements.

Figure 3A:
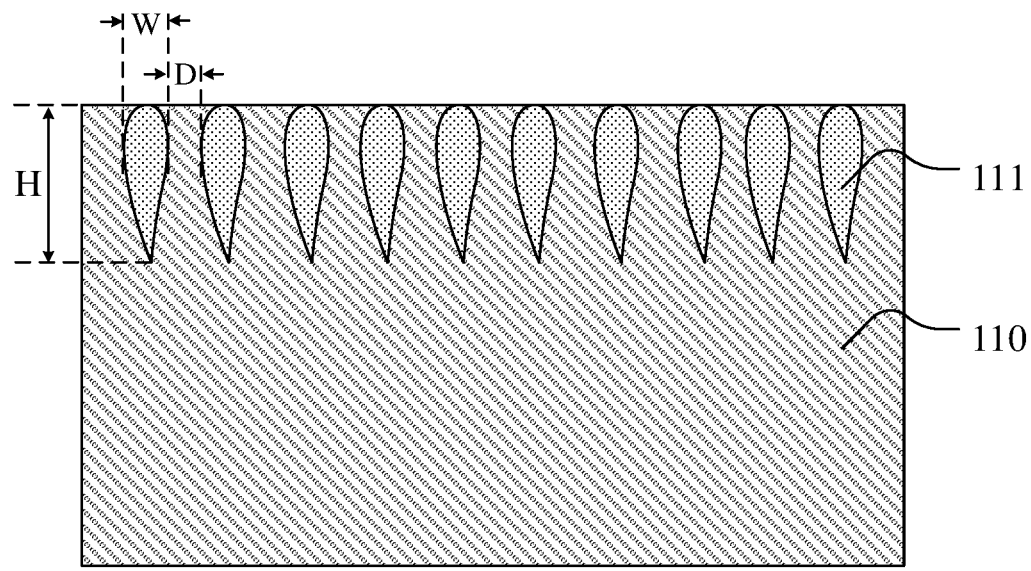

In step S102, as shown in FIG. 3*a*, an upper part of the high-resistance silicon substrate is formed into a plurality of local n-type semiconductor regions 111 by performing local n-type ion implantation to the high-resistance silicon substrate 110.

Figure 3B:
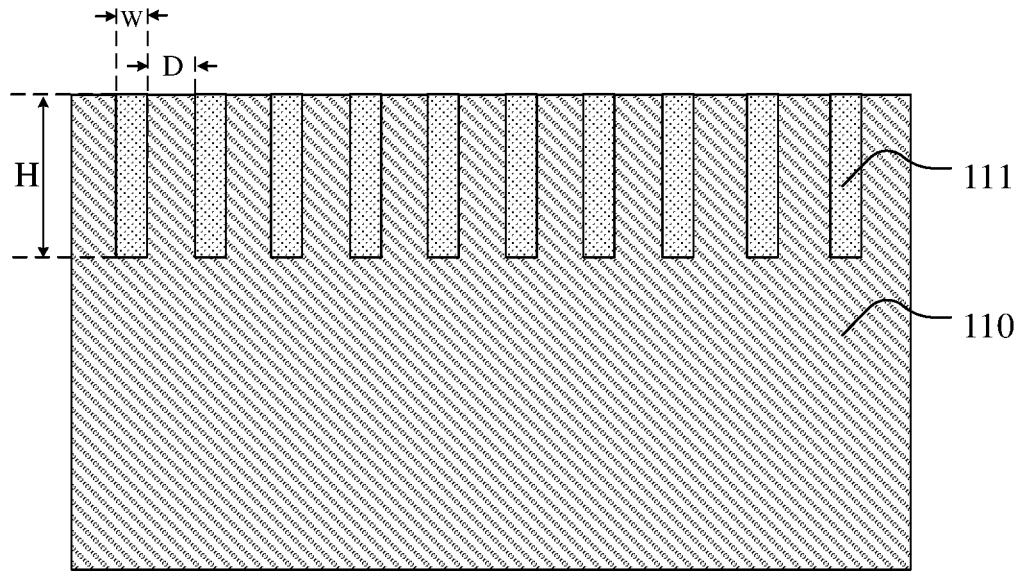
Figure 3C:
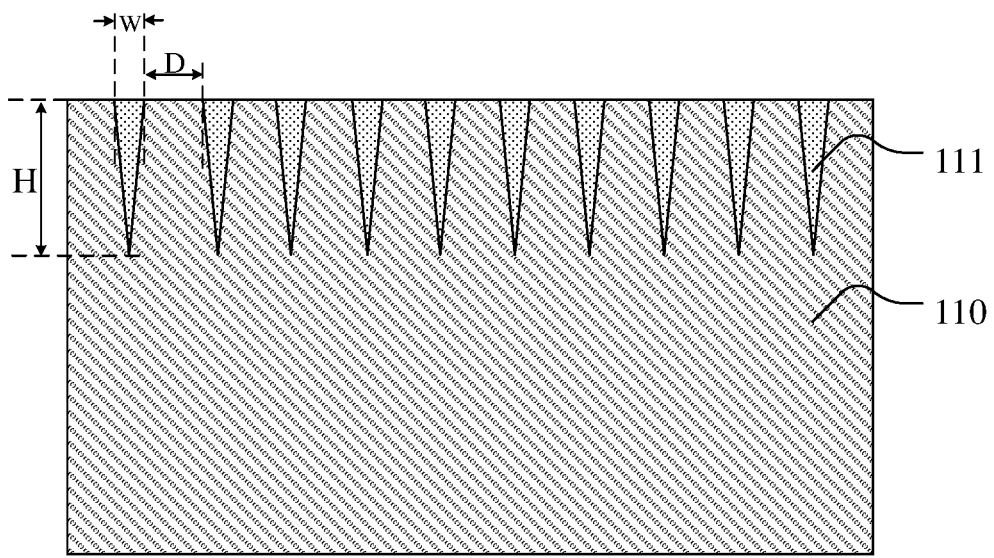
Figure 3D:
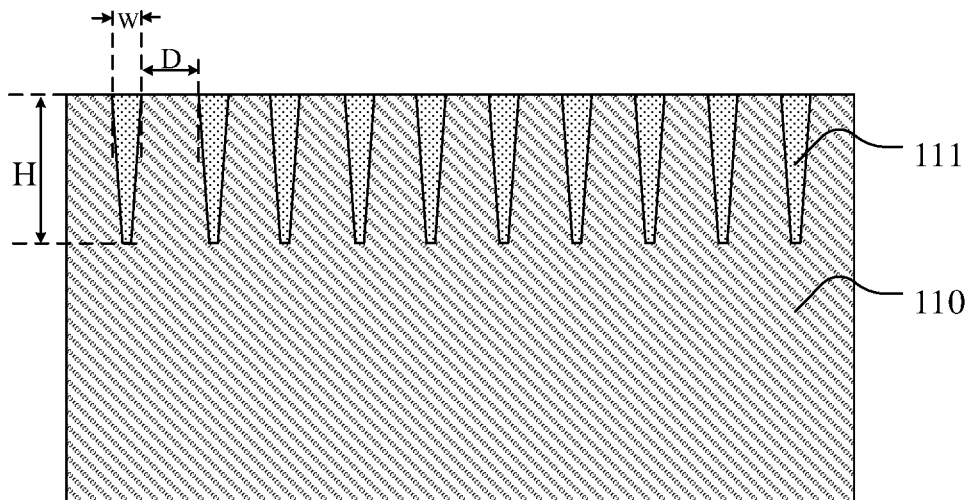

In this embodiment, the plurality of n-type semiconductor regions 111 are in a shape of droplet from a schematic cross-sectional view as shown in FIG. 3*a*. The cross-sectional shapes of the n-type semiconductor regions are not particularly limited in the present application. In other embodiments, the plurality of n-type semiconductor regions 111 may be in a shape of rectangular from the schematic cross-sectional view as shown in FIG. 3*b*; the plurality of n-type semiconductor regions 111 may be in a shape of triangular as shown in FIG. 3*c*; and the plurality of n-type semiconductor regions 111 may also be in a shape of trapezoidal as shown in FIG. 3*d*.

Figure 4A:
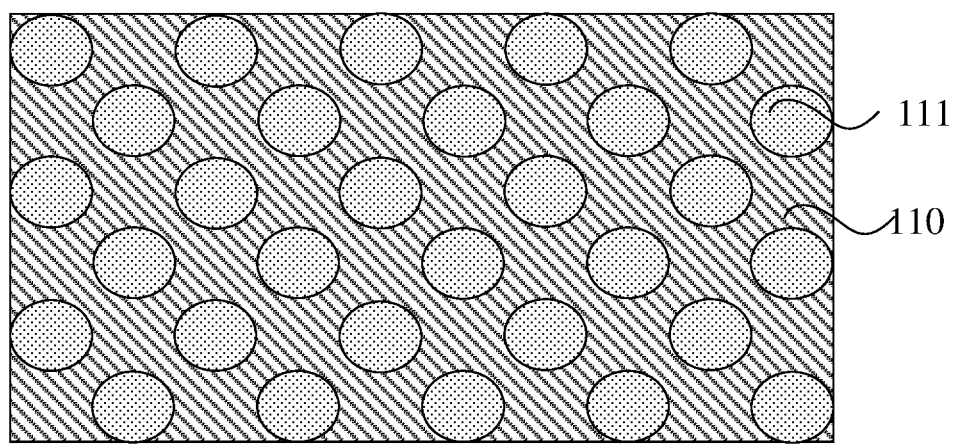
Figure 4B:
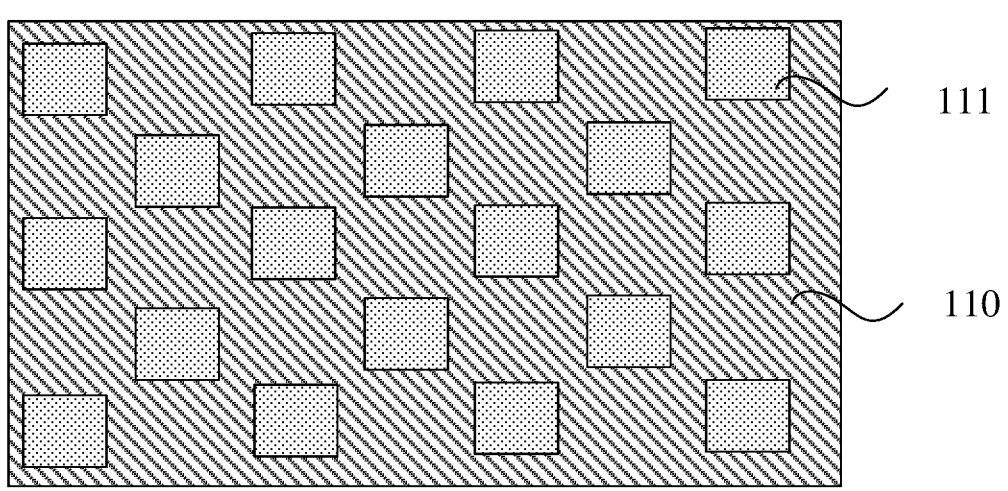
Figure 4C:
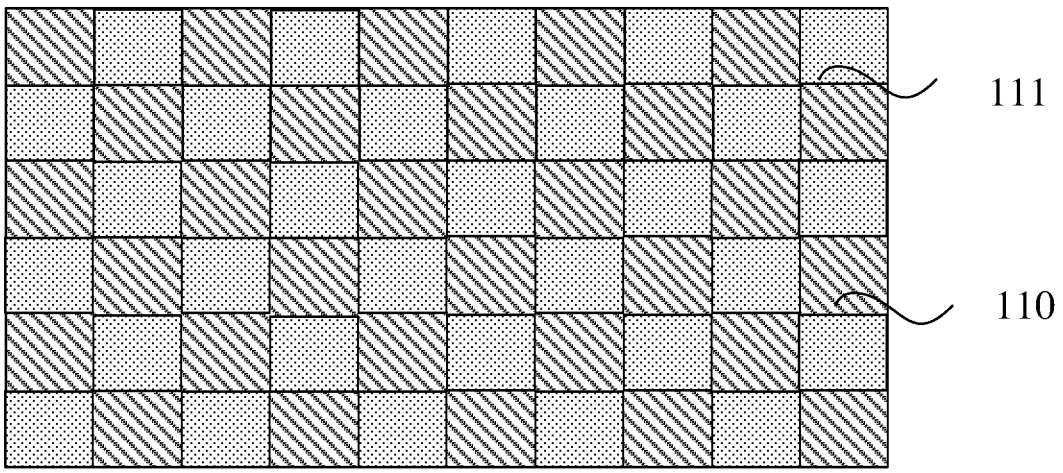
Figure 4D:
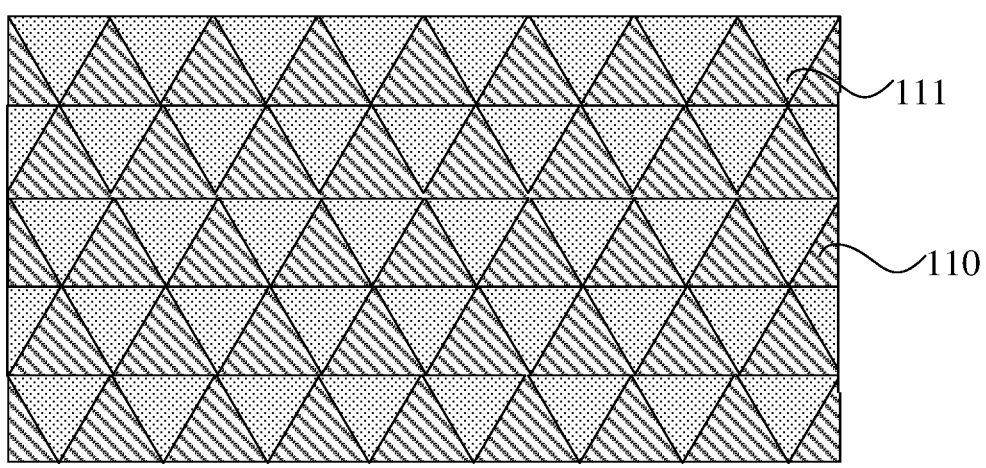
Figure 4E:
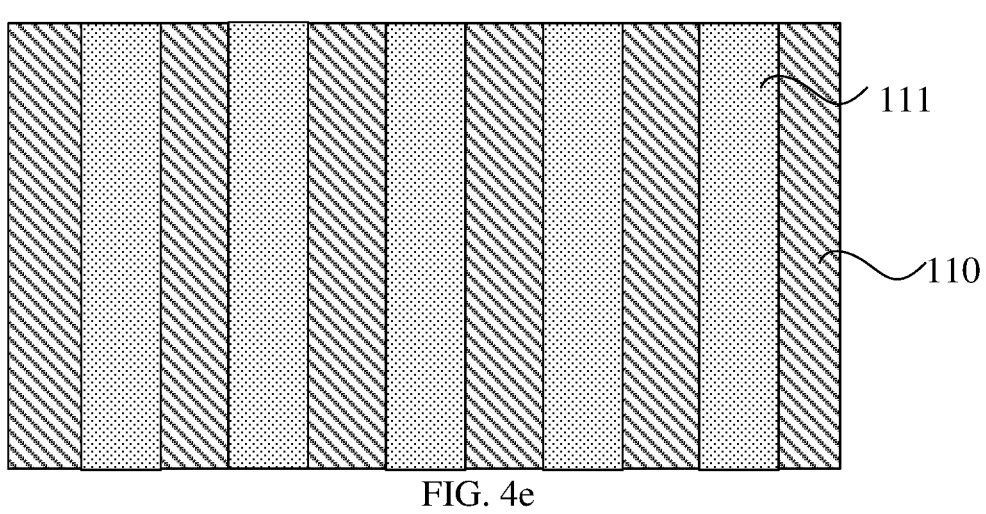
Figure 4F:
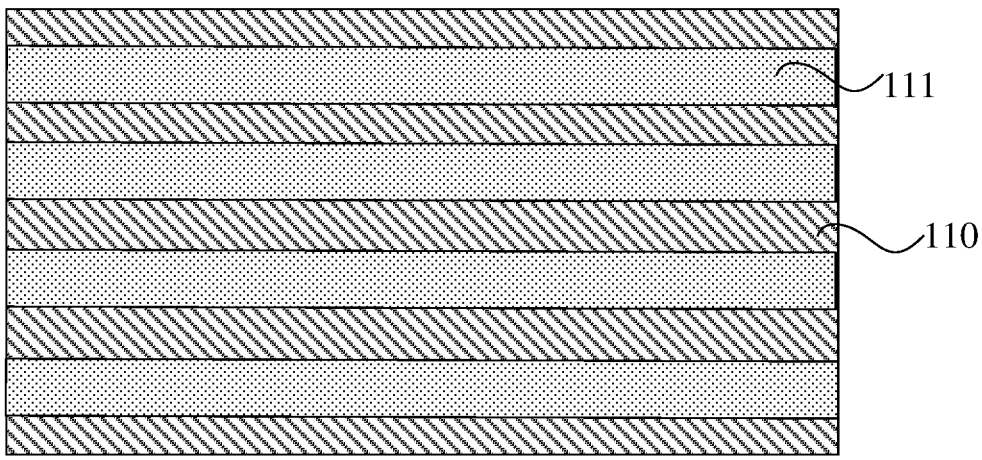
Figure 4G:
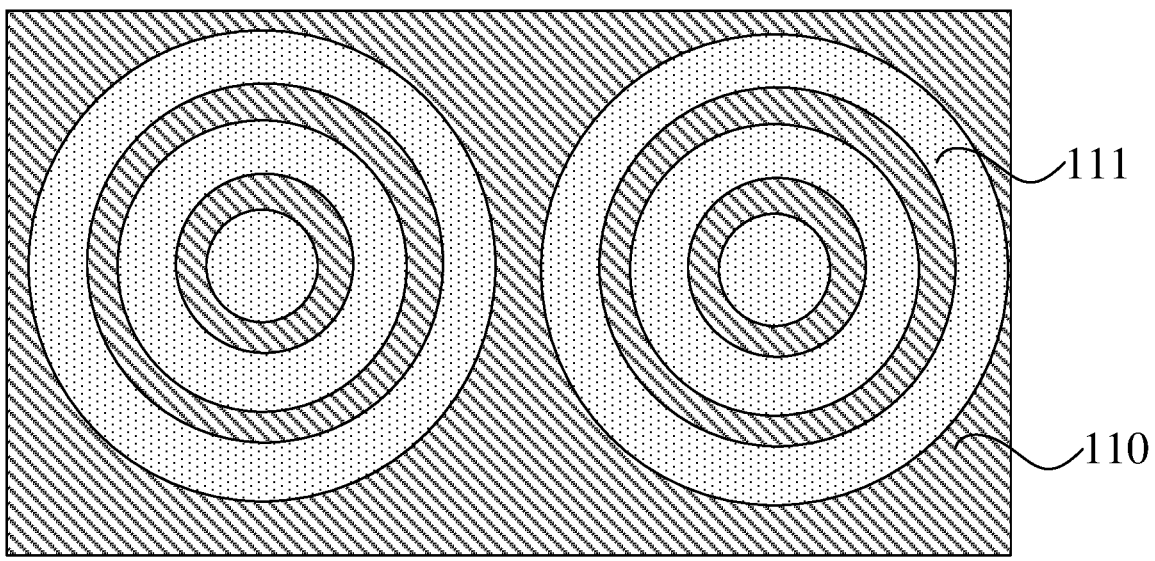

FIGS. 4*a*-4*e* show top views of the high-resistance silicon substrate 110 after ion implantation. The plurality of n-type semiconductor regions 111 may be in a shape of circular as shown in FIG. 4*a*, or may be separate rectangle as shown in FIG. 4*b*, or may be tangent rectangle as shown in FIG. 4*c* In other embodiments, the shape of the n-type semiconductor regions 111 may also be triangular as shown in FIG. 4*d*; further, the shape of the n-type semiconductor regions 111 may be a vertical strip shaped structure as shown in FIG. 4e, or it may also be a horizontal strip shaped structure as shown in FIG. 4f, or it may also be a concentric circle structure as shown in FIG. 4g. It should be understood that the concentric circle structure may be single or the same; and the shape of the n-type semiconductor regions 111 viewed from above is not specifically limited by the present application.

Figure 4H:
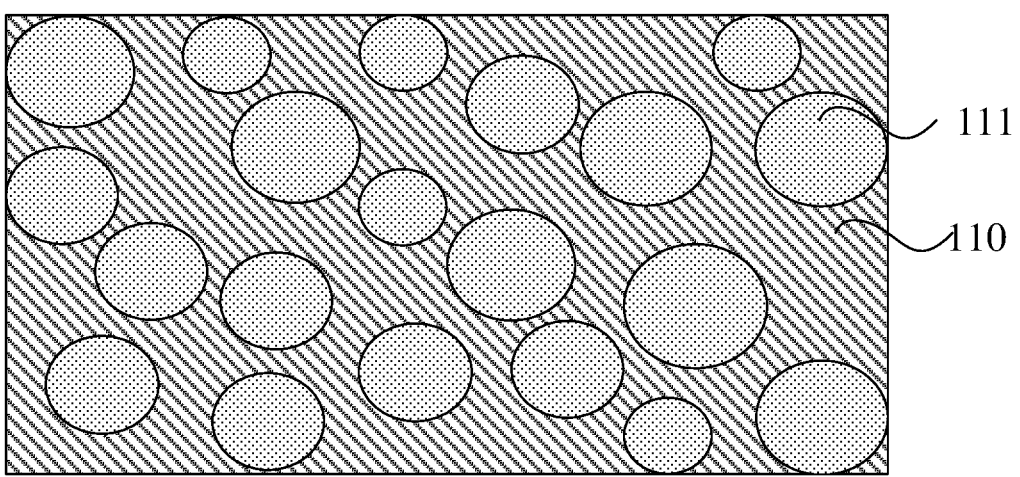

It can be seen from embodiments shown in FIGS. 4a-4g that a distribution of top-view shapes of the n-type semiconductor regions 111 is uniform on a surface of the high-resistance silicon substrate 110. In other embodiments, the distribution of the top-view shapes of the n-type semiconductor regions 111 may also be uneven on the surface of the high-resistance silicon substrate 110 as shown in FIG. 4h.

It should be understood that a cross-sectional shape, a top-view shape, a distribution rule, an interval size and so on of the n-type semiconductor regions 111 may be changed, as long as it can be ensured that the p-type semiconductor regions are completely depleted to form a space charge region in a lateral PN junction constituted by the n-type semiconductor regions and the p-type semiconductor regions formed by atoms diffusion, and thereby diffusion influence of Ga, Al and other atoms after growing epitaxially a compound layer is eliminated.

In the embodiment, the ions implanted are Phosphorus (P) ions. In other embodiments, the ions implanted may also be Nitrogen (N), Arsenic (As) and other ions.

Further, a depth H of an ion implantation concentrations of each of the plurality of n-type semiconductor regions is 0.01 μm~10 μm, a maximum width W of each of the plurality of n-type semiconductor regions in a lateral direction is 0.1 μm~2000 μm, and an interval between adjacent two of the plurality of n-type semiconductor regions is less than 2000 μm. A range of the ion implantation concentrations is 1E14 cm$^{-3}$~1E20 cm$^{-3}$, and a preferred range of the ion implantation concentration is 1E15 cm$^{-3}$~1E17 cm$^{-3}$.

In this embodiment, by locally implanting n-type ions into the upper portion of the high-resistance silicon substrate, the upper part of the high-resistance silicon substrate is formed into a plurality of the local n-type semiconductor regions. In other embodiments, the upper part of the high-resistance silicon substrate is formed into a plurality of the local n-type semiconductor regions by a way of selective region epitaxy, specifically as follows.

Figure 5A:
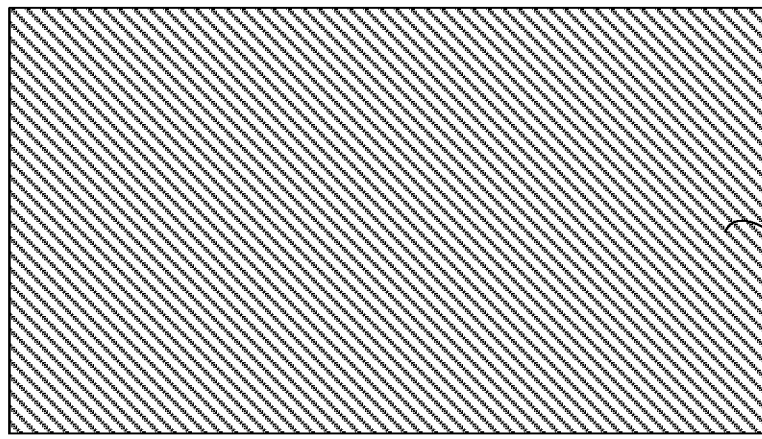

As shown in FIG. 5a, a high-resistance silicon substrate 210 is provided.

Figure 5B:
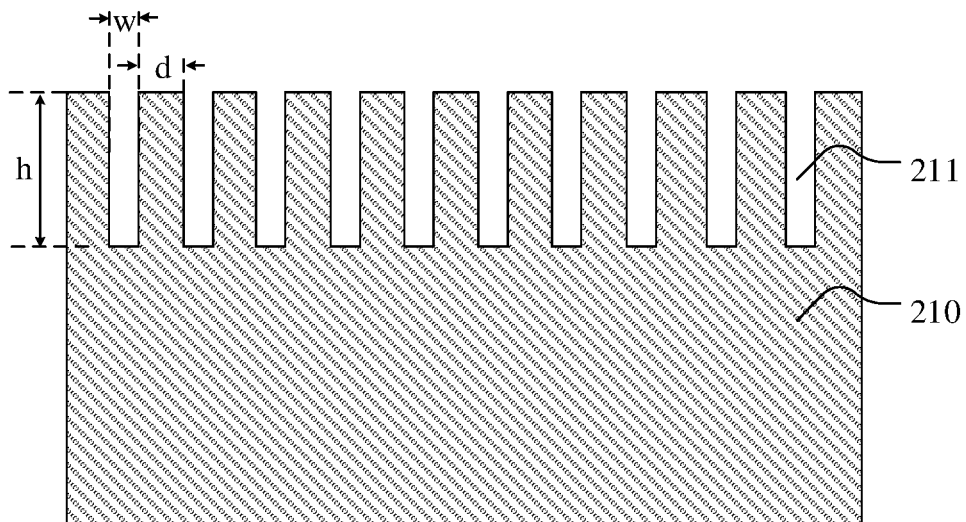

As shown in FIG. 5b, a part of the high-resistance silicon substrate 210 requiring selective region epitaxy growth is removed, such that a plurality of trenches 211 are formed in an upper part of the high-resistance silicon substrate 210.

Figure 5C:
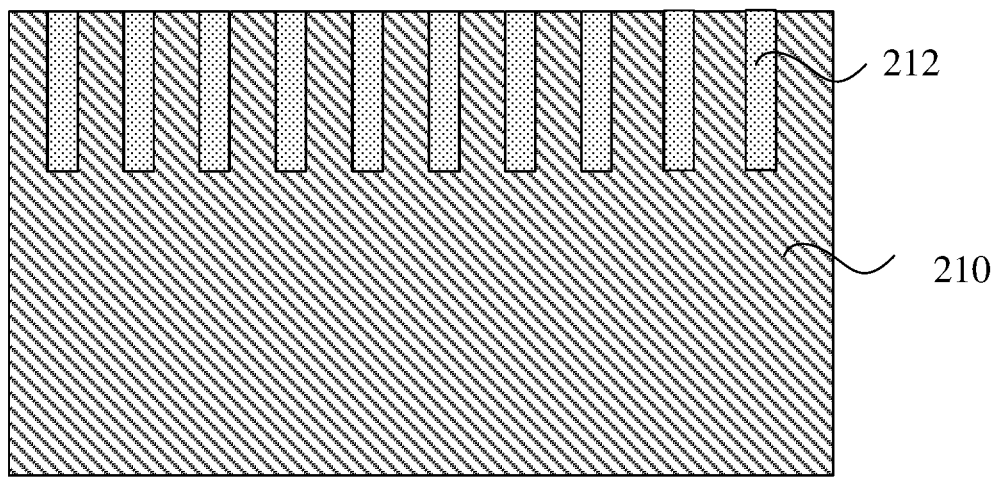

As shown in FIG. 5c, n-type semiconductor regions 212 are epitaxy grown in the trenches 211, a doping ion concentration of the plurality of n-type semiconductor regions is 1E14 cm$^{-3}$~1E20 cm$^{-3}$, and preferably, a range of concentrations is 1E15 cm$^{-3}$~1E17 cm$^{-3}$.

A depth h of each of the trenches 211 is 0.01 μm~10 μm, a maximum width w in a lateral direction is 0.1 μm~2000 μm, and an interval d between two adjacent trenches is less than 2000 μm. It can be understood that a shape of the n-type semiconductor regions 212 formed in the trenches 211 is the same as a cross-sectional shape, a top-view shape, a distribution rule, an interval size and so on of ion implantation regions 111 in an ion implantation method, which is not specifically limited, as long as it can be ensured that p-type semiconductor regions are completely depleted to form a space charge region in a lateral PN junction constituted by the n-type semiconductor regions of the upper part of the high-resistance silicon substrate and the p-type semiconductor regions formed by atoms diffusion, such that a diffusion influence of Ga, Al and other atoms after growing epitaxially a compound layer is eliminated.

In other embodiments, the upper part of the high-resistance silicon substrate may also be formed into a plurality of local n-type semiconductor regions by a way of n-type ion diffusion, specifically as follows.

Figure 6A:
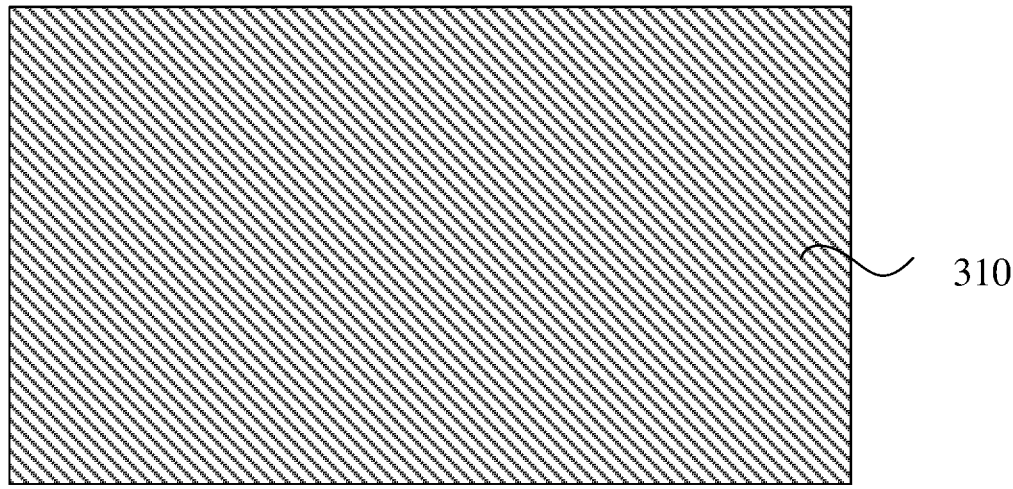

As shown in FIG. 6a, a high-resistance silicon substrate 310 is provided.

Figure 6B:
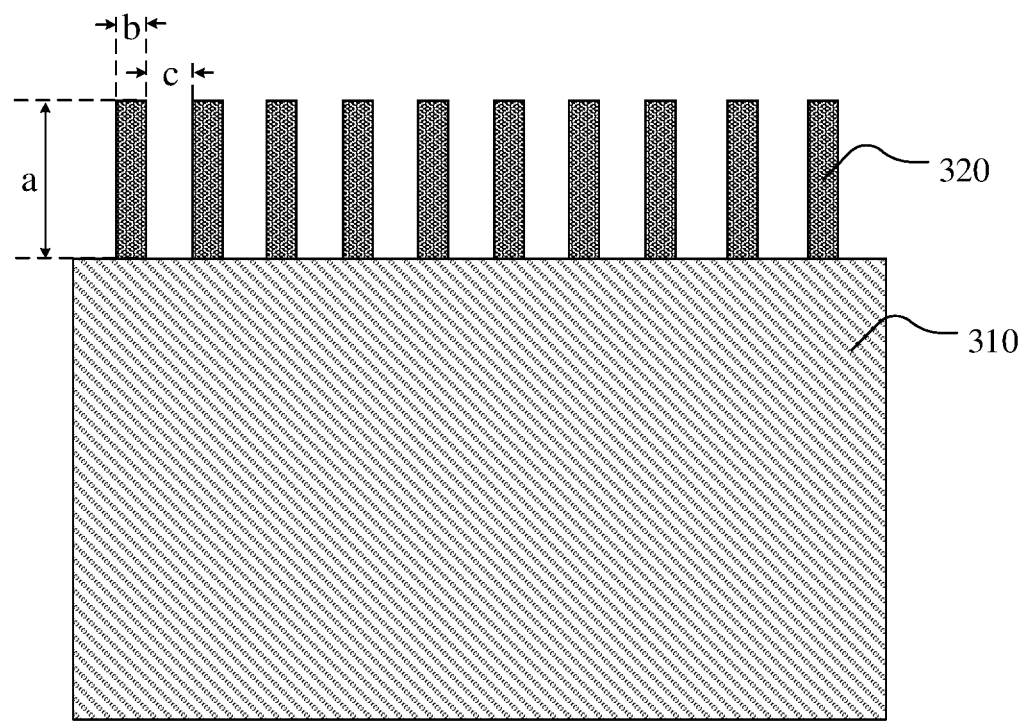

As shown in FIG. 6b, a plurality of n-type ion regions 320 are selectively epitaxy grown on an upper part of the high-resistance silicon substrate 310, and the n-type ion includes Phosphorus (P), Nitrogen (N), Arsenic (As) and the like.

Figure 6C:
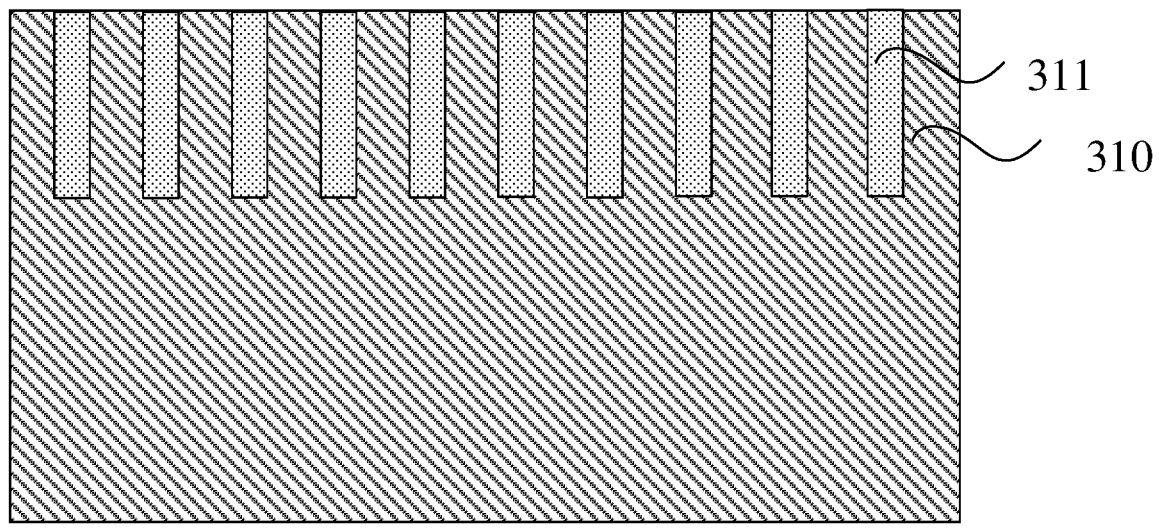

Due to a self-diffusion of the n-type ions in the n-type ion regions 320, a height a of each of the plurality of n-type ion regions is 0.01 μm~10 μm, and a maximum width b in a lateral direction is 0.1 μm~2000 μm, an interval c between two adjacent n-type ion regions is less than 2000 μm, such that a plurality of local n-type semiconductor regions 311 are formed in the high-resistance silicon substrate 310 as shown in FIG. 6c. A doping ion concentration of the plurality of n-type semiconductor regions is 1E14 cm$^{-3}$ to 1E20 cm$^{-3}$, and a preferred range of concentrations is 1E15 cm$^{-3}$ to 1E17 cm$^{-3}$.

It should be understood that a shape of the n-type semiconductor regions 311 formed by n-type ion diffusion is the same as a cross-sectional shape, a top-view shape, a distribution rule, an interval size and so on of ion implantation regions 111 in an ion implantation method, which is not specifically limited, as long as it can be ensured that p-type semiconductor regions are completely depleted to form a space charge region in a lateral PN junction constituted by the n-type semiconductor regions on the upper part of the high-resistance silicon substrate and the p-type semiconductor regions formed by atoms diffusion, and thereby diffusion influence of Ga, Al and other atoms after growing epitaxially a compound layer is eliminated.

Figure 7:
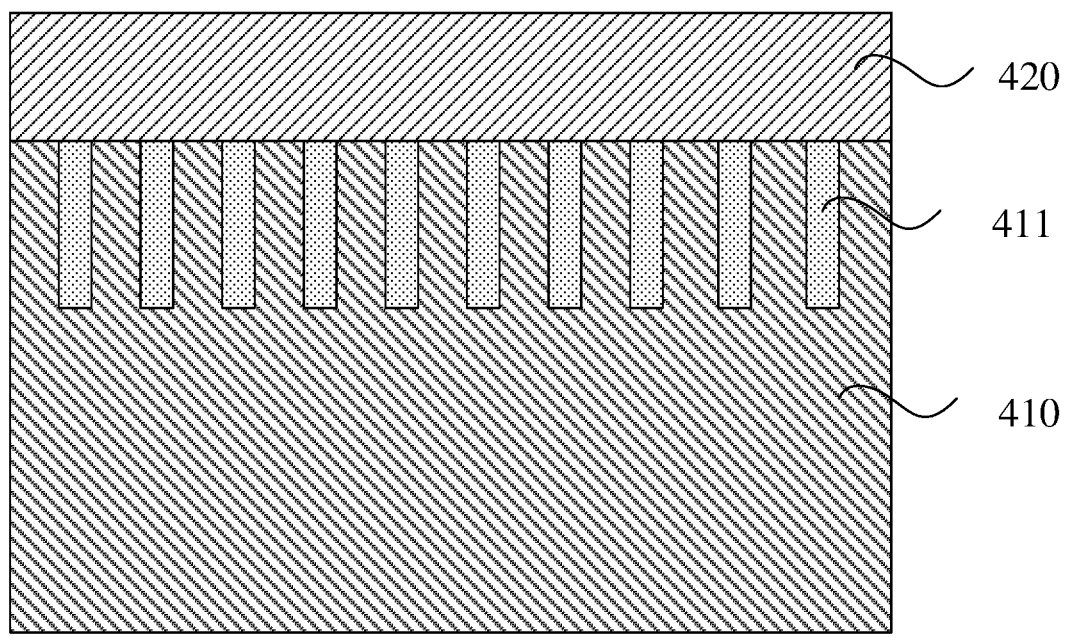

In step S103, as shown in FIG. 7, a compound layer 420 is epitaxy grown on a high-resistance silicon substrate 410, and the compound layer 420 at least includes an element, which diffuses into the high-resistance silicon substrate and forms a p-type semiconductor region in the high-resistance silicon substrate.

The compound layer 420 may be a III-V group compound layer containing III group atoms such as Ga, Al and the like, such as GaN, AlGaN, and AlInGaN and other semiconductor materials, and Ga and Al can diffuse into the high-resistance silicon substrate and form p-type semiconductor regions in the high-resistance silicon substrate. The compound layer 420 may also be a compound layer containing II group elements, elements contained in the compound layer is not limited specifically as long as it can be ensured that there is an element in the compound layer can diffuse into the high-resistance silicon substrate and form the p-type semiconductor regions in the high-resistance silicon substrate.

Figure 8A:
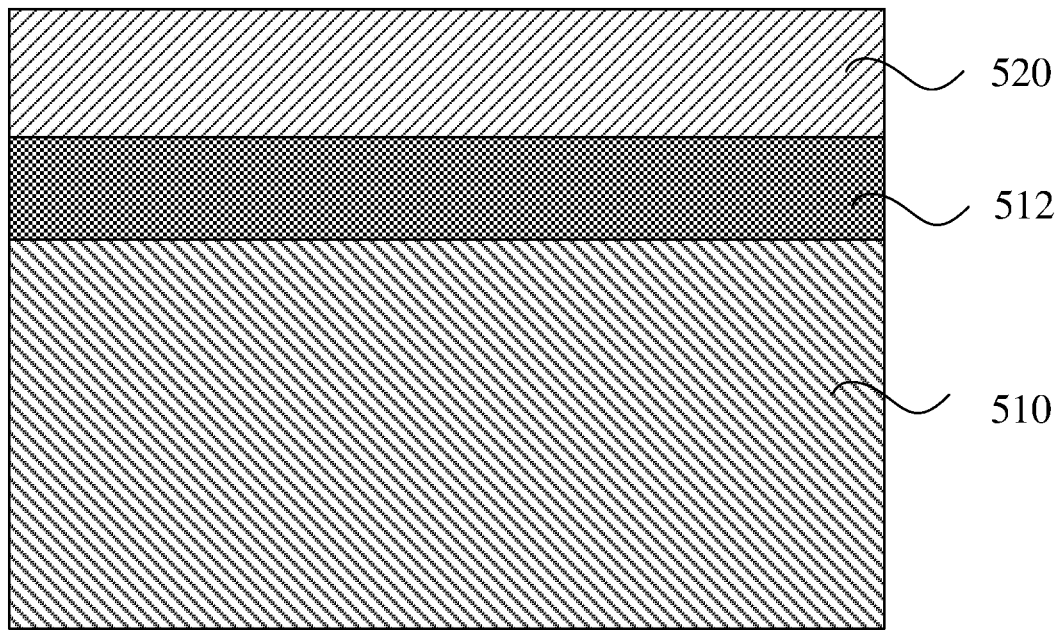
FIGS. 8*a* and 8*b* are implementation effect diagrams of a semiconductor structure provided by an embodiment of the present application.

It can be understood that atoms such as Ga, Al and the like in a compound layer 520 can diffuse into a high-resistance silicon substrate 510 after the compound layer 520 is epitaxy grown on the high-resistance silicon substrate 510, thereby a part of the high-resistance silicon substrate 510 is transformed into a p-type semiconductor region 512. As shown in FIG. 8a, the p-type semiconductor region 512, having a thickness of the p-type semiconductor region 512 ranges from 0.05 μm to 5 μm, is a conductive layer, which can seriously influence efficiency of a microwave device.

Figure 8B:
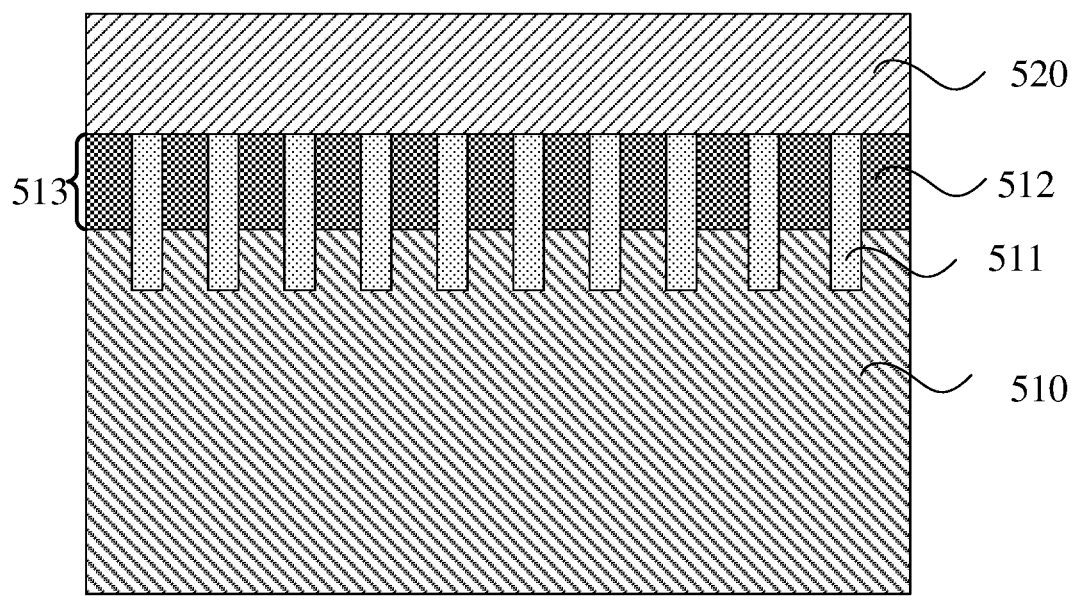

In a manufacturing method of a semiconductor structure adopted by the present application, an upper part of a high-resistance silicon substrate is formed into a plurality of n-type semiconductor regions locally arranged, and a doping concentration of the n-type semiconductor regions is greater than or equal to a doping concentration of the p-type semiconductor regions, such that, as shown in FIG. 8b, the p-type semiconductor regions are completely depleted to form space charge region 513 in a lateral PN junction formed by the p-type semiconductor regions and the n-type semiconductor regions, and thereby diffusion influence of Ga, Al and other atoms after growing epitaxially a compound layer is eliminated. There are only n-type semiconductor regions locally arranged in the high-resistance silicon substrate, thereby parasitic capacitance caused by a conductive substrate is greatly reduced, and a resistivity of the high-resistance silicon substrate is improved under high temperature conditions, and then efficiencies and radio frequency characteristics of a microwave device constituted by the entire semiconductor structure are improved.

As shown in FIG. 8b, a structure schematic diagram of a semiconductor structure is provided by an embodiment of the present application. The semiconductor structure includes a high-resistance silicon substrate 510 including a space charge region 513 and a compound layer 520 located on the high-resistance silicon substrate 510. The space charge region 513 is located in an upper part of the high-resistance silicon substrate 510 in contact with the compound layer 520. The compound layer 520 at least includes an element, the element such as Ga, Al and the like diffuses into the high-resistance silicon substrate and forms a p-type semiconductor region in the high-resistance silicon substrate.

A thickness of the space charge region is 0.01 μm~10 μm.

The high-resistance silicon substrate 510 also includes a plurality of n-type semiconductor regions 511 locally arranged.

Formation methods of the plurality of local n-type semiconductor regions include n-type ion implantation, selective region epitaxy, n-type ion diffusion and the like, and donor ions in n-type semiconductor are Phosphorus (P), Nitrogen (N), and Arsenic (As) and the like. A depth of each of the plurality of n-type semiconductor regions is 0.01 μm~10 μ, a width in a lateral direction is 0.1 μm~2000 μm, an interval between two adjacent n-type semiconductor regions is less than 2000 μm, a range of doping concentrations of the plurality of n-type semiconductor regions is $1E14$ $cm^{-3}$~$1E20$ $cm^{-3}$, and a preferred range of concentrations is $1E15$ $cm^{-3}$~$1E17$ $cm^{-3}$.

A resistivity of the high-resistance silicon substrate is greater than 100 Ω·cm. Preferably, the resistivity of the high-resistance silicon substrate is greater than 1000 Ω·cm.

A thickness of the high-resistance silicon substrate is 100 μm~1500 μm.

For simplifying and avoiding to obscure embodiments of the present application, a semiconductor structure and a method thereof described in the present application are applied to a semiconductor device, and the semiconductor device is described in detail. The semiconductor device includes a semiconductor device (diodes, transistors, integrated circuits and the like) performing predetermined electronic functions in a controlled manner, and includes a semiconductor device (LEDs, lasers and the like) performing predetermined photonic functions in a controlled manner. In the present application, a transistor is configured as an example to describe the semiconductor structure in detail, but the semiconductor device applied the semiconductor structure in the present application is not limited to the example in the present application.

Figure 9:
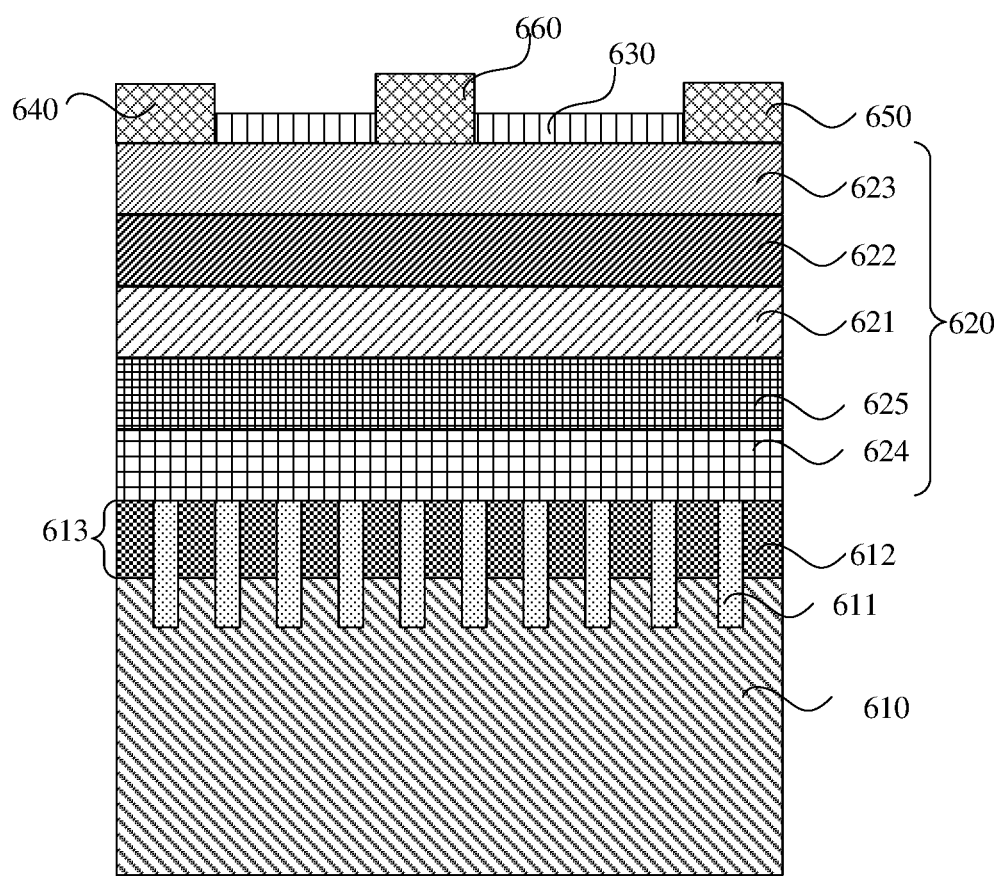
FIG. 9 is a structure schematic diagram of a transistor including a semiconductor device.

FIG. 9 shows a device structure of a transistor applied the semiconductor structure. A transistor device includes a high-resistance silicon substrate 610, space charge region 613, a III-V group compound layer 620, a passivation layer 630, a source electrode 640, a drain electrode 650 and a gate electrode 660.

In an embodiment, local n-type ion implantation is performed on a surface of the high-resistance silicon substrate 610. Further, the III-V group compound layer 620 includes a back barrier layer 621, a channel layer 622, and an upper barrier layer 623, the back barrier layer 621 and the upper barrier layer 623 may be AlGaN, and the channel layer 622 may be GaN. Further, the III-V group compound layer 620 also includes a nucleation layer 624 and a buffer layer 625, the nucleation layer 624 may be AN, and the buffer layer 625 may be AlGaN. In other embodiments, the upper barrier layer 623 may not be disposed, and the channel layer 622 is undoped or n-doped.

In the embodiment, the passivation layer 630 may include silicon nitride, silicon dioxide, aluminum nitride, aluminum oxide, aluminum oxynitride and the like.

In the embodiment, each of the source electrode 640 and the drain electrode 650 forms an ohmic contact with the upper barrier layer 623, and the gate electrode 660 forms a schottky contact with the passivation layer 630. In the transistor device of the embodiment, Al and Ga atoms in the III-V group compound layer 620 diffuse into the high-resistance silicon substrate 610, so that p-type semiconductor regions 612 are formed in a surface of the high-resistance silicon substrate. By pre-implanting n-type ions such as phosphorus, nitrogen, arsenic and the like in the high-resistance silicon substrate, so that an upper part of the high-resistance silicon substrate is formed into a n-type semiconductor regions 611 in advance, and so that the p-type semiconductor regions 612 and the n-type semiconductor regions form a space charge region 613, thereby p-type semiconductor conductive regions formed on the high-resistance silicon substrate due to diffusion of Al and Ga atoms are eliminated, a parasitic capacitance caused by a conductive substrate is greatly reduced, and a resistivity of the high-resistance silicon substrate under high temperature conditions can be improved.

In the embodiment, a depth of the n-type semiconductor regions 611 is greater than a thickness of the p-type semiconductor regions 612. It can be understood that the depth of the n-type semiconductor regions 611 may be less than or equal to the thickness of the p-type semiconductor region 612 in other embodiments as long as it can be ensured that the p-type semiconductor regions are completely depleted to form the space charge region 613 or partly depleted to form unconnected space charge region 613 in a lateral PN junction constituted by the n-type semiconductor regions on an upper part of the high-resistance silicon substrate and the p-type semiconductor regions formed by atoms diffusion, and thereby diffusion influence of Ga, Al atoms after growing epitaxially the III-V group compound layer is eliminated.

In summary, a semiconductor structure in embodiments of the present application is by performing a way such as local n-type ion implantation, selective region epitaxy growth, local n-type ion diffusion and the like to a high-resistance silicon substrate, an upper part of the high-resistance silicon substrate is formed into a plurality of local n-type semiconductor regions so as to eliminate p-type semiconductor conductive regions formed that Al, Ga atoms in a compound layer are diffused on the upper part of the high-resistance silicon substrate in a subsequent process, the entire surface of the high-resistance silicon substrate generally has high-resistance characteristics, and there are only n-type semiconductor regions locally arranged, thereby parasitic capacitance caused by a conductive substrate is greatly reduced, and resistivity of the high-resistance silicon substrate may be improved under high temperature conditions, and then efficiencies and radio frequency characteristics of a microwave device constituted by the entire semiconductor structure are improved.

It should be explained that after growing the III-V group compound layer on the high-resistance silicon substrate, N, P, As and other atoms in the III-V group compound layer will make a part of the high-resistance silicon substrate transforms into the n-type semiconductor regions due to diffusion, which influences performance of a device, for example, an InP layer is epitaxy grown on the high-resistance silicon substrate, P atoms will diffuse into the high-resistance silicon substrate, so that a part of the high-resistance silicon substrate is transformed into the n-type semiconductor regions. Therefore, similarly, Gallium (Ga), Boron (B), Aluminum (Al) and other ions may be pre-implanted in the high-resistance silicon substrate to make the high-resistance silicon substrate form the p-type semiconductor regions in advance, so that the lateral PN junction is constituted by the n-type semiconductor regions formed by diffusion atoms and the p-type semiconductor regions, and n-type regions are completely depleted to form the space charge region, thereby diffusion influence of N, P, and As atoms after growing epitaxially the III-V compound layer is eliminated.

It should also be explained that, in the description of the present application, unless otherwise clearly specified and limited, terms "disposed", "installation", "connected", and "connection" should be understood in a broad sense, for example, may be a fixed connection, and may also be a detachable connection or an integral connection; may be a mechanical connection, and may also be an electrical connection; may be directly connected, and may also be indirectly connected through an intermediate medium, and may be communication between two components. For those of ordinary skill in the art, specific meanings of the above terms in the present application may be understood in specific situations.

It should be noted that similar reference numerals and letters indicate similar items in the following drawings, therefore, once an item is defined in one drawing, there is no need to further define and explain it in subsequent drawings.

In description of the present application, it should be explained that orientation or positional relationship indicated by terms "center", "upper", "lower", "left", "right", "vertical", "horizontal", "inner", "outer" and so on is based on orientation or positional relationship shown in the drawings, or orientation or positional relationship conventionally placed when an invented product is used. It is only for being convenient for describing the present application and simplifying the description, rather than indicating or implying that referred equipment or components must have a specific orientation and be constructed and operated in the specific orientation, and therefore it may not be understood as a limitation of the present application. In addition, terms "first", "second", "third" and so on are only configured to distinguish the description and may not be understood as indicating or implying relative importance.

The above are only preferred embodiments of the present application and are not intended to limit the present application. For those skilled in the art, the present application may have various modifications and changes. Any modification, equivalent replacement, improvement and so on made within the spirit and principle of the present application shall be included in the protection scope of the present application.

What is claimed is:

1. A manufacturing method of a semiconductor structure, comprising:
   providing a high-resistance silicon substrate;
   forming an upper part of the high-resistance silicon substrate into a plurality of n-type semiconductor regions; and
   growing epitaxially a compound layer on the high-resistance silicon substrate;
   wherein the high-resistance silicon substrate comprises a space charge region located at a position where an upper part of the high-resistance silicon substrate is in contact with the compound layer; and the high-resistance silicon substrate comprises a p-type semiconductor region having at least one doping element diffused from the compound layer into the high-resistance silicon substrate, a depth of one of the plurality of n-type semiconductor regions is greater than a depth of the p-type semiconductor region, a length at a top of one of the plurality of n-type semiconductor regions is greater than a length at a bottom of the one of the plurality of n-type semiconductor regions, and a doping concentration of the plurality of n-type semiconductor regions is greater than that of the p-type semiconductor region, such that the p-type semiconductor region is completely depleted to form the space charge region in a lateral PN junction formed by the p-type semiconductor region and the plurality of n-type semiconductor regions.

2. The manufacturing method of the semiconductor structure according to claim 1, wherein the compound layer is a III-V group compound layer.

3. The manufacturing method of the semiconductor structure according to claim 2, wherein the III-V group compound layer comprises a back barrier layer, a channel layer, and an upper barrier layer.

4. The manufacturing method of the semiconductor structure according to claim 1, wherein the method for forming an upper part of the high-resistance silicon substrate into a plurality of n-type semiconductor regions comprises n-type ion implantation, selective region epitaxy and n-type ion diffusion.

5. The manufacturing method of the semiconductor structure according to claim 1, wherein a depth of each of the plurality of n-type semiconductor regions is 0.01 µm~10 µm.

6. The manufacturing method of the semiconductor structure according to claim 1, wherein a width of each of the plurality of n-type semiconductor regions is 0.1 µm~2000 µm.

7. The manufacturing method of the semiconductor structure according to claim 1, wherein an interval between adjacent two of the plurality of n-type semiconductor regions is less than 2000 µm.

8. The manufacturing method of the semiconductor structure according to claim 1, wherein a resistivity of the high-resistance silicon substrate is greater than 100 Ω·cm.

9. The manufacturing method of the semiconductor structure according to claim 1, wherein a doping ion concentration of the plurality of n-type semiconductor regions is $1E14 cm^{-3} \sim 1E20 cm^{-3}$.

10. The manufacturing method of the semiconductor structure according to claim 1, wherein the plurality of n-type semiconductor regions are in a shape of droplet, triangular, or trapezoidal from cross-sectional view.

11. The manufacturing method of the semiconductor structure according to claim 1, wherein the plurality of n-type semiconductor regions are in a shape of circular, separate rectangle, tangent rectangle, triangular, vertical strip shaped structure, horizontal strip shaped structure, or concentric circle structure from top view.

12. A semiconductor structure, comprising:
   a high-resistance silicon substrate, wherein the high-resistance silicon substrate has a plurality of n-type semiconductor regions; and
   a compound layer located on the high-resistance silicon substrate;
   wherein the high-resistance silicon substrate comprises a space charge region located at a position where an upper part of the high-resistance silicon substrate is in contact with the compound layer; and the high-resistance silicon substrate comprises a p-type semiconductor region having at least one doping element diffused from the compound layer into the high-resistance silicon substrate, a depth of one of the plurality of n-type semiconductor regions is greater than a depth of the p-type semiconductor region, a length at a top of the one of the plurality of n-type semiconductor regions is greater than a length at a bottom of the one of the plurality of n-type semiconductor regions, and a doping concentration of the plurality of n-type semiconductor regions is greater than that of the p-type semiconductor region, such that the p-type semiconductor region is completely depleted to form the space charge region in a lateral PN junction formed by the p-type semiconductor region and the plurality of n-type semiconductor regions.

13. The semiconductor structure according to claim 12, wherein the compound layer is a III-V group compound layer.

14. The semiconductor structure according to claim 13, wherein the III-V group compound layer comprises a back barrier layer, a channel layer, and an upper barrier layer.

15. The semiconductor structure according to claim 12, wherein a doping ion concentration of the plurality of n-type semiconductor regions is $1E14 cm^{-3} \sim 1E20 cm^{-3}$.

16. The semiconductor structure according to claim 12, wherein a depth of each of the plurality of n-type semiconductor regions is 0.01 µm~10 µm.

17. The semiconductor structure according to claim 12, wherein the plurality of n-type semiconductor regions are in a shape of droplet, triangular, or trapezoidal from cross-sectional view.

18. The semiconductor structure according to claim 12, wherein the plurality of n-type semiconductor regions are in a shape of circular, separate rectangle, tangent rectangle, triangular, vertical strip shaped structure, horizontal strip shaped structure, or concentric circle structure from top view.

19. The semiconductor structure according to claim 12, wherein a thickness of the space charge region is 0.01 µm~10 µm.

* * * * *